United States Patent
Goronkin et al.

(10) Patent No.: US 6,211,530 B1
(45) Date of Patent: Apr. 3, 2001

(54) SPARSE-CARRIER DEVICES AND METHOD OF FABRICATION

(75) Inventors: Herbert Goronkin, Tempe; Raymond K. Tsui, Phoenix; Ruth Y. Zhang, Gilbert; Kumar Shiralagi, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/097,026

(22) Filed: Jun. 12, 1998

(51) Int. Cl.[7] .................... H01L 29/06; H01L 29/205; H01L 29/88
(52) U.S. Cl. ............................ 257/17; 257/20; 257/24
(58) Field of Search .................... 257/17, 24, 20

(56) References Cited

U.S. PATENT DOCUMENTS

| 5,614,435 | 3/1997 | Petroff et al. . |
| 5,783,840 | * 7/1998 | Randall ................. 257/24 |
| 5,888,885 | * 3/1999 | Xie ....................... 438/493 |
| 5,905,273 | * 5/1999 | Hase ...................... 257/24 |

* cited by examiner

Primary Examiner—Jerome Jackson, Jr.
(74) Attorney, Agent, or Firm—Eugene A. Parsons; William E. Koch

(57) ABSTRACT

A sparse-carrier device includes a crystal structure with a crystallographic facet having contacts at opposite ends. Quantum dots are formed in first and second rows on the facet approximately one quantum dot wide and a plurality of quantum dots long, the quantum dots in the first row being separated from each other by a first distance smaller than a second distance between the quantum dots in the first row and adjacent quantum dots in a second row. The first distance is small enough to allow carrier tunneling between adjacent quantum dots and the second distance is large enough to substantially prevent tunneling between adjacent quantum dots and small enough to allow Coulombic interaction between adjacent quantum dots. Electrical contacts are formed at opposite ends of the rows to allow tunneling of carriers into and out of quantum dots in the first and second rows.

12 Claims, 3 Drawing Sheets

SPARSE-CARRIER DEVICES AND METHOD OF FABRICATION

FIELD OF THE INVENTION

The present invention pertains to devices that operate through the conduction of a very small number of electrical carriers and to methods of fabricating the devices.

BACKGROUND OF THE INVENTION

A relatively recent development in material science has been the ability to fabricate structures that are small on a quantum scale. On this small scale, 200 Å or less, the applicable physics is no longer that of the solid state bulk nor that of the gaseous free atom, but rather that of a quantum confined intermediate. Early in the development these small scale structures were formed in layers with confinement in one dimension only. The confined structures are typically composed of thin layers produced by MBE equipment on GaAs or other active substrates.

As an example of a use of these thin layers, lasers have been made that utilize the quantum confinement layers for carrier confinement or refractive optical confinement. In quantum-mechanically confined nanostructures, the degree of freedom in the free-electron motion decreases as N, the number of confined dimensions, goes up. This change in the electronic density of states has long been predicted to increase efficiency and reduce temperature sensitivity in lasers, and has been demonstrated for N=1 and 2. The techniques for the production of very thin layers of material with reasonable electronic mobilities require very meticulous crystal growth and exceedingly high purity.

For the ultimate case of N=3, there is also the occurrence of Coulomb blockade, a phenomenon that provides the basis for the operation of single-electron devices. Generally, a 3-D confined nanostructure is a small particle of material, e.g., semiconductor material, that is small enough to be quantum confined in three dimensions. That is, the quantum contained particle has a diameter that is only about 200 Å or less. This creates a three dimensional well with quantum confinement in all directions.

Traditionally, attempts to fabricate 3-D confined nanostructures relied on e-beam lithography. More recently, STM/AFM and self-assembled quantum dots (3-D confined nanostructures) have been fabricated. However, incorporating the 3-D confined nanostructures into a useful device is very difficult and has not been accomplished in a manufacturable process.

Accordingly, it would be very beneficial to be able to efficiently manufacture 3-D confined nanostructures in a useful device.

It is a purpose of the present invention to provide 3-D confined nanostructures in a useful device.

It is another purpose of the present invention to provide 3-D confined nanostructures in an inverter.

It is a further purpose of the present invention to provide a new and efficient method of manufacturing 3-D confined nanostructures.

SUMMARY OF THE INVENTION

The above problems and others are at least partially solved and the above purposes and others are realized in a sparse-carrier device including a crystal structure formed of a first material and having a crystallographic facet with contact structures at opposite ends of the length. Quantum dots are formed of a second material, using self-aligned techniques, and positioned in a plurality of rows on the crystallographic facet with each row extending along the length of the crystallographic facet and being approximately one quantum dot wide and a plurality of quantum dots long. The crystallographic facet is defined with a width to restrict formation of the second material thereon to the plurality of quantum dot wide rows of quantum dots. The quantum dots in a first row of the plurality of rows are separated from adjacent quantum dots in the first row by a first distance smaller than a second distance between the quantum dots in the first row and adjacent quantum dots in an adjacent row, and the quantum dots in the second row are separated from adjacent quantum dots in the second row by the first distance smaller than the second distance between the quantum dots in the second row and adjacent quantum dots in the first row. The first distance is small enough to allow carrier tunneling between adjacent quantum dots along a row and the second distance is large enough to substantially prevent tunneling between adjacent quantum dots between rows while being small enough to allow Coulombic interaction between adjacent quantum dots between rows. Electrical contacts are positioned on the contact structures at opposite ends of the rows with the electrical contacts being spaced from the quantum dots in the plurality of rows a distance to allow tunneling of carriers into and out of quantum dots in the plurality of rows.

In a specific application, a first row of the plurality of rows of quantum dots is connected to receive input signals and a second parallel spaced apart row of the plurality of rows of quantum dots is connected to provide an output signal. The quantum dots in the second row are charged oppositely to quantum dots in the first row by Coulombic interaction between adjacent quantum dots so that output signals from the second row are inverted from input signals supplied to the first row.

A method is disclosed of fabricating a sparse-carrier device including the steps of providing a crystal substrate of a first material and forming a crystal structure on the crystal substrate, the crystal structure being formed by growing a crystallographic facet of the first material with a predetermined width and length. Quantum dots of a second material are then selectively grown, using self-aligned techniques, in a plurality of rows on the crystallographic facet with each of the rows extending in parallel spaced apart relationship along the length of the crystallographic facet and being approximately one quantum dot wide and a plurality of quantum dots long. The plurality of rows of quantum dots are further selectively grown so that the quantum dots in a first row of the plurality of rows are separated from adjacent quantum dots in the first row by a first distance smaller than a second distance between the quantum dots in the first row and adjacent quantum dots in an adjacent second row, and the quantum dots in the second row are separated from adjacent quantum dots in the second row by the first distance smaller than the second distance between the quantum dots in the second row and adjacent quantum dots in the first row. Further, the first distance is small enough to allow carrier tunneling between adjacent quantum dots within each of the rows and the second distance is large enough to substantially prevent tunneling between adjacent quantum dots between rows and small enough to allow Coulombic interaction between adjacent quantum dots between rows.

BRIEF DESCRIPTION OF THE DRAWINGS

Referring to the drawings.

DESCRIPTION OF THE PREFERRED EMBODIMENT

Figure 1:
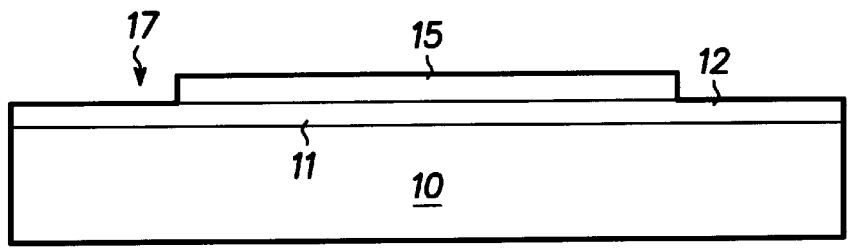
FIGS. 1 through 4 are greatly enlarged, simplified sectional views illustrating a preferred method of patterning a substrate for further processing.

Turning now to the drawings, FIGS. 1–4 illustrate several steps in a preferred method of masking a gallium arsenide substrate 10 for the fabrication of sparse carrier devices. While the present masking method is utilized because of its convenience (the substrate does not have to be removed from the growth chamber throughout the operation), other masking methods known in the semiconductor art may be utilized, if desired. It should be understood that gallium arsenide substrate 10 is utilized herein for purposes of this description but other III-V compounds and other semiconductor materials may be utilized in other applications. Referring specifically to FIG. 1, a simplified sectional view of gallium arsenide substrate 10 having a surface 11 is illustrated. It should be understood that substrate 10 might simply be a supporting structure, such as a wafer or the like, or it might include various layers (not shown) formed on or in the supporting structure.

Surface 11 of gallium arsenide substrate 10 has a film 12 (generally 20 angstroms or less thick) of a native oxide which, as is well known in the art, forms substantially instantaneously upon exposure to air. The native oxide is not necessary to the present invention and is only illustrated because it is generally present and requires special procedures to prevent. In some applications various types of passivation may be used, to prevent the formation of film 12, in which case such passivation may have to be removed before the present procedure can be performed. It has been found that the present technique will operate generally as described with the surface simply being clean (i.e. no foreign matter).

A mask 15 is positioned adjacent to surface 11 of substrate 10 for patterning surface 11, as will be explained presently. Mask 15 generally is a shadow or metal mask but, in some special applications, it can be formed in the well known manner with photolithography as in an aligner or stepper (generally includes a projected image from a mask). As will become apparent presently, one of the major advantages of the present technique is that photolithography and the like are not necessary for the described masking operations. In a preferred embodiment, mask 15 is a mask plate with metal lines and other features, for example, a chrome mask. In any case, mask 15 is positioned adjacent surface 11 so as to define one or more growth areas 16 on surface 11 beneath mask 15 and one or more unmasked portions 17 on surface 11 of substrate 10.

Figure 2:
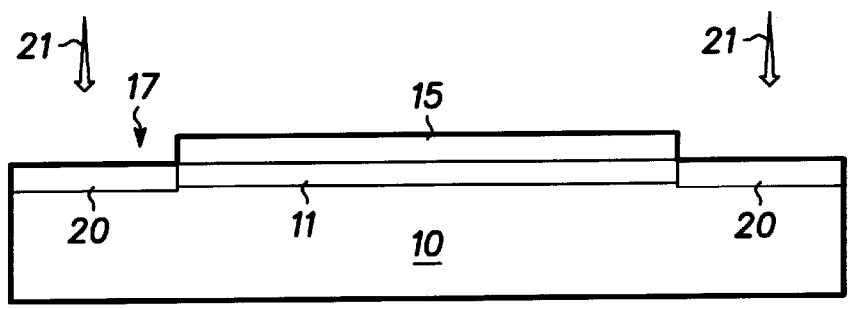

Unmasked portions 17 of surface 11 are exposed to a bright light preferably including deep ultraviolet, represented by arrows 21 in FIG. 2. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. It is believed that exposure to other wavelengths, such as 248 nm in a specific example, modifies the composition of the surface or native oxide by forming a different kind of oxide (i.e. UV oxide) or complex oxide molecules that are more stable than the native oxide. The exposure to light can be performed under a lamp. However, when the light is collimated, as in an aligner or stepper, sharp features can be defined in unmasked portion 17 or in masked portion 16 by mask 15. In this specific example, gallium arsenide wafer 10 with layer 12 of native oxide on the surface was provided. Standard bright lights, both at 185 nm and at 248 nm, were used with the wafer being exposed through a chrome coated mask for 5 minutes. UV oxide film 20 with a thickness less than approximately 2 nm was produced in the unmasked areas.

Figure 3:
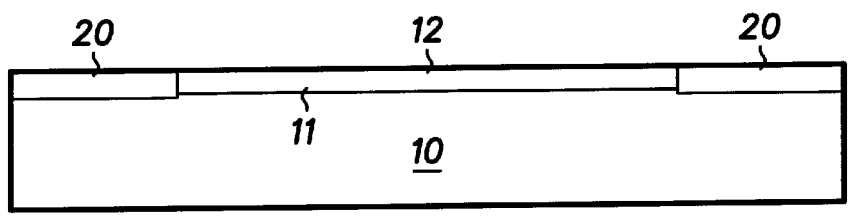
Figure 4:
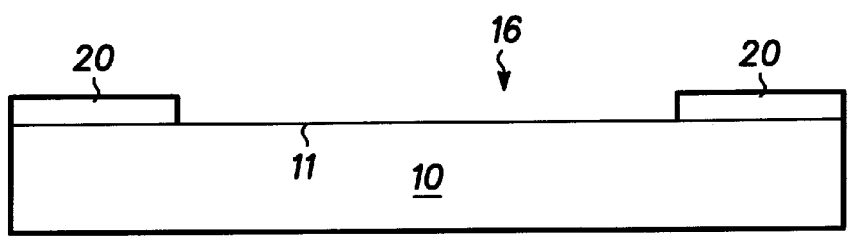

Once UV oxide film 20 is grown, mask 15 is removed to expose growth area 16, as illustrated in FIG. 3. UV oxide film 20 then serves as a mask for further process operations, such as growth, etching, and so on, and can be easily removed in situ by heating or the use of TDMAA, if necessary. As an example of further operations, substrate 10 is then introduced into a growth chamber (not shown) and heated to a temperature of approximately 580° C. to desorb any native oxide that may still be present in growth area 16. Substrate 10 with native oxide-free growth area 16 is illustrated in FIG. 4.

Figure 5:
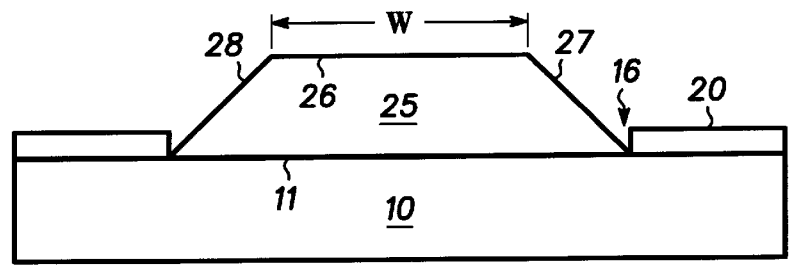
FIG. 5 is a greatly enlarged, simplified sectional view illustrating crystalline material with a facet selectively grown on the patterned substrate of FIG. 4 in accordance with the present invention.

While retaining substrate 10 in the growth chamber, selective growth of crystalline, or semiconductor, material 25 in growth area 16 is performed, as illustrated in FIG. 5. With oxide film 20 in place as a mask for further growth, a predetermined amount of crystalline material 25 is selectively grown in area (or areas) 16. For purposes of this disclosure, "selective growth" or "selectively grown" is defined as growing only in the specific or designated area. In this specific example, GaAs is grown using selective area epitaxy (SAE) and well defined crystallographic facets develop, while no growth occurs on oxide film 20. Further, since material 25 grows in a crystalline form, growth rates and shapes are crystallographic dependent, i.e. the rate and shape of growth are dependent upon the type of material 25 being utilized.

In the specific example illustrated in FIG. 5, opening 16 is between approximately 1 micron and 1.5 microns wide and may extend lengthwise (into and out-of the figure) as far as desired, generally several microns. GaAs is grown on exposed surface 11 of substrate 10 by chemical beam epitaxy using tri-isopropylgallium and arsine as the source materials. In this specific example, tri-isopropylgallium is used because it allows for lower growth temperatures that are more compatible with the resistless oxide film 20. Other possible processes include using triethylgallium and arsine at a substrate temperature of approximately 620° C.

By carefully controlling the amount of growth, the crystalline structure illustrated in FIG. 5 is grown with an upper facet 26 having a width 'w' of, for example, approximately 200 nm. It will be noted that the crystalline structure is basically a mesa with facet 26 forming the upper surface. Two other facets 27 and 28 are also grown but, as will be explained, are not used. The limits on the width 'w' of facet 26 are related to a desired quantum dot diameter and density, or number of rows of quantum dots. The lower limit for 'w' is equal to the fewest number of rows of quantum dot desired (e.g. 2). In principle, only one row of quantum dots will be formed on the facet if the width 'w' is less than the average dot-to-dot distance, d, given by $d=1/(\rho)^{1/2}$, where $\rho$ is the areal dot density. For example, d=100 nm if $\rho=1\times10^{10}/cm^2$. Both the quantum dot diameter and the density are influenced by the growth conditions. It should be noted that too much material 25 (i.e. crystalline growth) results in a peak (no upper facet 26) and too little material 25 results in too wide a facet 26. Further, in this specific embodiment, the crystalline structure is arranged so that upper facet 26 is the (100) facet of the GaAs. It is expected that other facets and/or facets directed other than upwardly, may be used in other applications and the present embodiment is utilized only for purposes of explanation.

Figure 6:
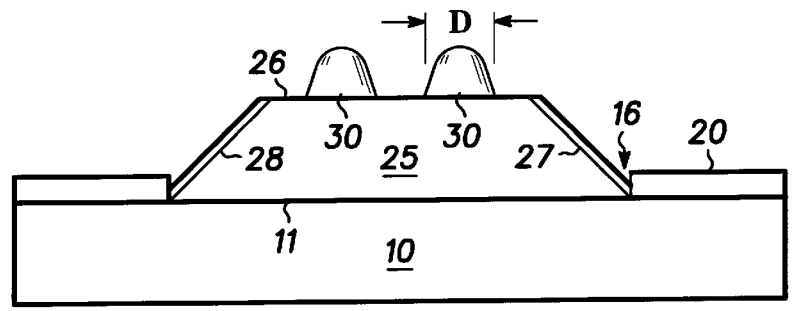
FIG. 6 is a greatly enlarged, simplified sectional view illustrating a plurality of rows of quantum dots selectively grown on the facet of the crystalline material illustrated in FIG. 5 in accordance with the present invention.

Turning now to FIG. 6, a second crystalline material is selectively grown on facet 26 of crystal material 25. In a specific example, InAs was selectively grown using trimethyl indium and arsine in a chemical beam epitaxy. The growth rates of InAs are different on the various GaAs facets and, utilizing this fact, InAs grows only on the (100) facet thick enough for strain-induced islanding to occur and quantum structures herein referred to as a quantum dots 30 are produced. The strain-induced islanding is sometimes referred to as resulting in self-organized quantum dots (SOQDs). However, for simplicity the resulting structures will be referred to herein as 'quantum dots'. Each quantum dot 30 is a small particle of material, e.g., semiconductor material, that is small enough to be quantum confined in three dimensions. That is, quantum dot 30 has a diameter, D, that is less than about 250 Å, generally in a range of 20 nm to 25 nm. This creates a three dimensional well with quantum confinement in all directions. InAs growth on facets 27 and 28 is either too slow or non-existent so that no strain-induced islanding can occur on these facets. The ability to avoid InAs growth on oxide layer 20 and the amount of InAs that nucleates on other facets (e.g. facets 27 and 28) are strongly dependent on the growth conditions.

In this specific example, the temperature of the substrate was lowered to approximately 525° C. and, using trimethylindium as the source, indium was delivered onto facet 26 together with arsine. The flux levels of In and As and the amount of time in which they are delivered determine the total amounts delivered to facet 26. In the example of InAs quantum dots formed on GaAs, the diameter 'D' is typically 20 nm to 30 nm or less with a height of approximately 7–8 nm. Also, the quantum dots are formed with a density of approximately $10^{10}-10^{11}$ quantum dots/cm². Deposition of additional mismatched material results in coalescence of individual quantum dots and formation of dislocations.

It should be understood that the formation of the quantum dots on an unlimited surface occurs in a generally random location. However, it has been found that the quantum dot density for given growth conditions is, to a large extent, a function of the facet width. For a given total indium (In) flux (for example) delivered to the surface, the areal density of the quantum dots increases as the facet width is reduced. Thus, by adjusting the width 'w' of facet 26, rows of quantum dots 30, each row being approximately one quantum dot wide and a plurality of quantum dots long, are produced along the length of facet 26.

By progressively reducing the width w of facet 26 below 200 nm, three rows, two rows, or even a single aligned row of quantum dots 30 are formed. The overall shape of facet 26 is also controlled by the appropriate design of the oxide pattern on the substrate (see FIGS. 1–4). This overall shape also influences the way quantum dots 30 form.

Figure 7:
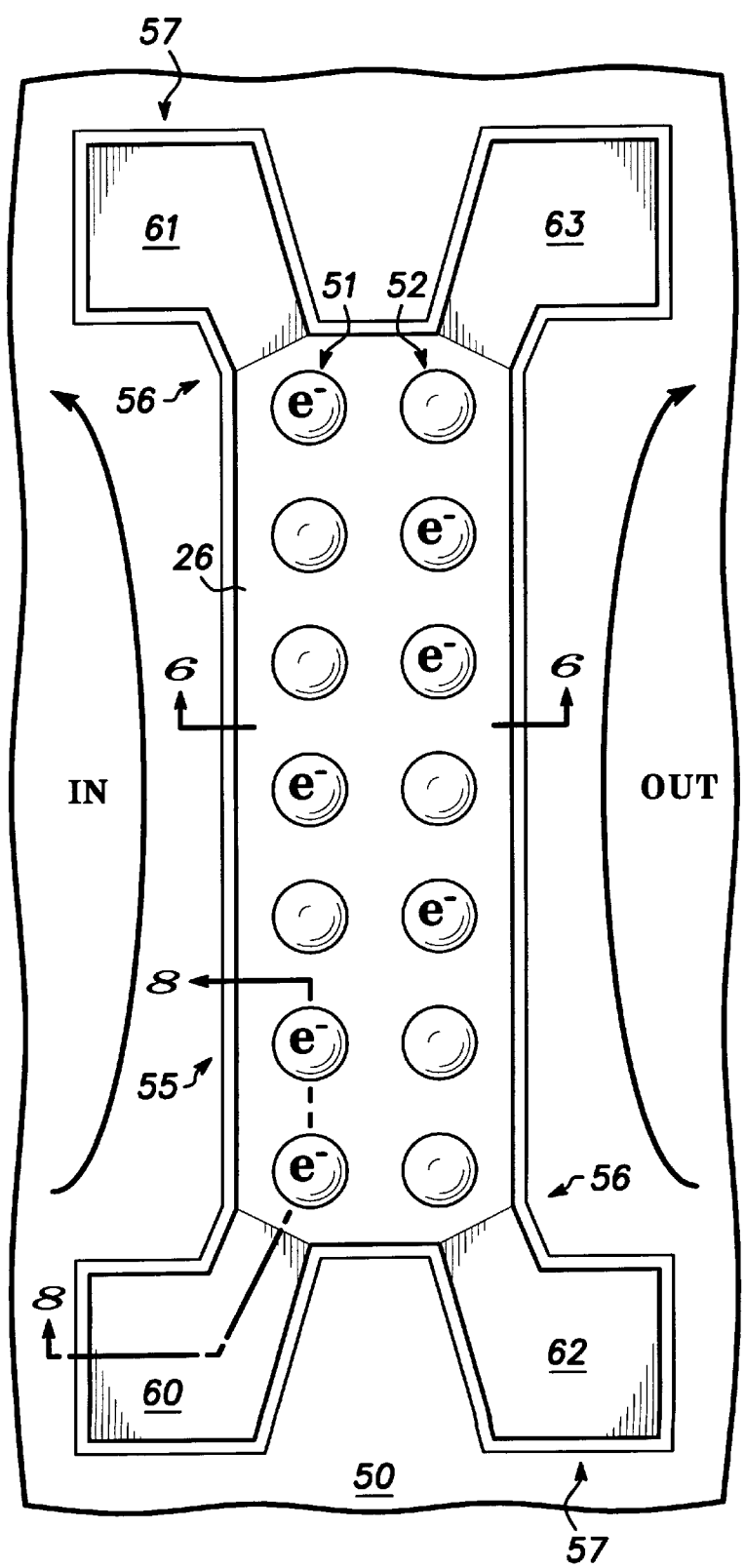
FIG. 7 is an enlarged view in top plan of a sparse-carrier device in accordance with the present invention.

Referring to FIG. 7 in which a quantum device, in this specific example an inverter 50, is illustrated in a greatly simplified top plan. In inverter 50 the above described principals are utilized to provide the complete quantum device. Also, the enlarged sectional view illustrated in FIG. 6 is seen along the line 6—6 of FIG. 7. It should be noted that the relative sizes of the various components are not to scale but are illustrated to best aid the reader in understanding the concept. Inverter 50 includes an input row 51 of quantum dots 30 and a parallel spaced apart output row 52 of quantum dots 30 positioned on crystallographic facet 26. Further, crystallographic facet 26 is constructed with an intermediate portion 55 having a substantially constant width, portions 56 adjacent each of the opposite ends of crystallographic facet 26 which are wider than intermediate portion 55, and end portions 57 of the crystallographic facet 26 which are widened further and divided to provide separate contact areas, designated 60 through 63, for each of rows 51 and 52.

As can be seen from FIG. 7, in intermediate portion 55, where the width of crystallographic facet 26 is narrow, two well aligned rows 51 and 52 of quantum dots 30 are formed. As the width of crystallographic facet 26 is broadened, the density and uniformity of the quantum dots is reduced. Thus by careful design, portions 56 and contact areas 60 through 63 are provided with either no quantum dots, a single row of quantum dots (not shown) for contact purposes, or with widely dispersed quantum dots (not shown).

Quantum dots 30 in inverter 50 are typically 20 nm to 25 nm in diameter. At this scale, each quantum dot 30 behaves like an artificial atom when it is charged with an electron (or hole in an opposite embodiment) which has associated with it discrete energy levels. Within each of the rows 51 and 52, quantum dots 30 are separated from adjacent quantum dots 30 by a distance of approximately 10 nm. Specifically, quantum dots 30 in row 51 are separated from adjacent quantum dots 30 in row 51 by approximately 10 nm. Similarly, quantum dots 30 in row 52 are separated from adjacent quantum dots 30 in row 52 by approximately 10 nm. Thus, the tunneling of an electron (or hole) from one quantum dot 30 in a row to an adjacent quantum dot 30 in the same row readily occurs within this distance. However, the spacing between rows 51 and 52, for example, is approximately 20 nm so that the spacing between adjacent quantum dots 30 within a row is substantially smaller than the spacing between adjacent quantum dots 30 between rows, e.g. rows 51 and 52. Thus, tunneling of an electron (or hole) between quantum dots 30 in adjacent rows is much less likely to occur. This is illustrated by the following. The probability of an electron tunneling through an energy barrier of thickness t and height $E_B$ is proportional to $\exp(-\beta t/h)$, where $\beta=(2mE_B)^{0.5}$, with m=mass of an electron and h=Planck's constant. Assuming a reasonable barrier height of $E_B$=0.2 eV, an increase in t from 10 nm to 20 nm reduces the tunneling probability by a factor of about $10^{-21}$. On the other hand, the Coulombic force between charges a distance r apart drops off only as 1/r. Thus Coulombic interaction between adjacent quantum dots in adjacent rows still occurs. This means that the presence of an electron (or hole) in one quantum dot 30 of row 51, for example, creates a local potential such that it becomes energetically more difficult to charge an electron into the quantum dot in row 52 directly opposite the charged quantum dot.

While the exact reason for the quantum dot spacing between rows being greater than the spacing between adjacent quantum dots within a row is not known, this difference is confirmed by models and tests. It is believed that the edges of crystallographic facet 26 have an effect on the position of the rows relative to the edges. That is, because of the edges, the crystallographic strain caused by the lattice mismatch between the first material (GaAs in this case) and the second material (InAs in this case) across intermediate portion 55 from the upper edge in FIG. 7 to the lower edge is not uniform and there is a tendency for the rows to form adjacent the edges. Such non-uniformity in strain may arise since the crystalline nature close to an edge can be substantially different from that of the central portion of crystallographic facet 26, which in this case is of (100) orientation. However, the crystallographic strain across intermediate portion 55 from left to right is uniform so that quantum dots 30 within each of the rows are substantially equally spaced. Generally, it has been found that widening the facet results in a row being formed adjacent each edge with the spacing between rows increasing until the width becomes sufficient to allow a third row to form between the two rows at the edges. Thus, two general rules dictate the formation of rows 51 and 52 of quantum dots 30: first, the crystallographic facet 26 must be wide enough to allow the growth of two rows and narrow enough to prevent the growth of three rows; and second, the crystallographic facet must be wide enough so that the spacing between adjacent quantum dots in different rows is greater than adjacent quantum dots in the same row.

Figure 8:
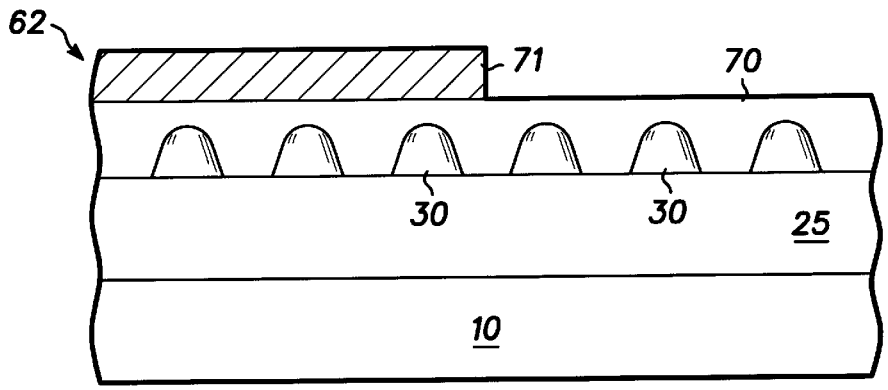
FIG. 8 is a greatly enlarged sectional view as seen generally from the line 8—8 in FIG. 7.
Figure 9:
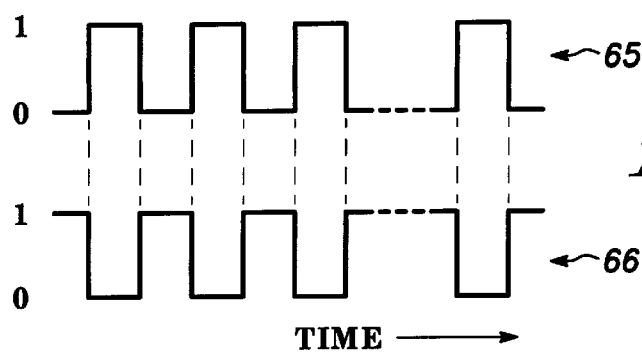
FIG. 9 illustrates typical input and output waveforms for the sparse-carrier device of FIG. 7.

Referring specifically to FIG. 8, a greatly enlarged sectional view is illustrated as seen from the line 8—8 of FIG. 7. Generally, FIG. 8 illustrates one embodiment for providing electrical connections to device 50. As described in conjunction with FIG. 6, crystal material 25 is grown on substrate 10 to form crystallographic facet 26. After quantum dots 30 are formed on facet 26 a layer 70 of GaAs or the like is grown over the structure. Here it should be understood that the areas of portions 56 and contact areas 60 through 63 are illustrated much smaller In FIG. 7 for convenience. Actually, the areas of portions 56 and contact areas 60 through 63 will generally be large enough that quantum dots may be present in a low density non-uniform arrangement or, in the case of contact areas 60 through 63, a thin layer of InAs may form rather than quantum dots. In any case, an electrical contact 71 is deposited on layer 70 so as to partially overlie some of the quantum dots 30. A similar arrangement is provided at each contact area 60 through 63. Thus, electrical communication is provided with rows 51 and 52 of quantum dots 30 from electrical contacts 71 on contact areas 60 through 63 by way of layer 70.

Generally, in inverter 50 described and illustrated in FIG. 7, electrons introduced at contact area 60 of row 51 migrate or tunnel to contact area 61 if the proper potentials are applied. While electrons are the prime carrier in this example, it is expected that structures utilizing holes as the carriers could also be fabricated using the precepts described herein. When an input signal, consisting of a number of 1's and 0's (e.g. upper waveform designated 65 of FIG. 8), is applied to contact area 60 of inverter 50, quantum dots 30 of row 51 are selectively charged with electrons in accordance with the input pattern. The symbol e⁻ (illustrated in FIG. 7) within some of the quantum dots 30 in row 51 indicate the charge pattern. The Coulombic repulsion effect is such that quantum dots 30 in row 52 have a charge pattern (indicated by the symbol e⁻ within quantum dots 30) that is the inverse of the charge pattern of row 51. This results in an output signal characteristic between contact areas 62 and 63 of an inverter. Although single quantum dots 30 are illustrated (for simplicity) as representative of each pulse in waveforms 65 and 66, it will be understood by those skilled in the art that this is the ultimate structure and generally in practical structures rows 51 and 52 of quantum dots 30 may actually contain many more quantum dots, with a plurality of dots representing each pulse in the waveforms 65 and 66.

A pair of spaced apart parallel rows of quantum dots are utilized and explained in conjunction with inverter 50, but it will be understood by those skilled in the art that additional rows may be incorporated for additional applications with the carrier and Coulombic interaction being used to achieve other desirable results. One advantage of the present inverter is that one can have a n-bit inverter for n quantum dots per row. The small size and high density of the quantum dots makes this an extremely compact circuit that is suitable for ultra-large scale integration. Thus, new and novel sparse-electron devices and efficient method of manufacturing the sparse electron devices have been disclosed. Further, while specific examples are utilized herein for purposes of explanation, those skilled in the art will understand that many varieties of materials and forms may be utilized.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A sparse-carrier device comprising:

a crystal structure formed of a first material and having a crystallographic facet with a width and a length, the crystallographic facet having contact structures at opposite ends of the length;

quantum dots formed of a second material and positioned in a plurality of rows on the crystallographic facet, each row extending along the length of the crystallographic facet and being approximately one quantum dot wide and a plurality of quantum dots long, the crystallographic facet being defined with a width to restrict formation of the second material thereon to the plurality of quantum dot wide rows of quantum dots, the quantum dots in a first row of the plurality of rows being separated from adjacent quantum dots in the first row by a first distance smaller than a second distance between the quantum dots in the first row and adjacent quantum dots in an adjacent row, and the quantum dots in the adjacent row being separated from adjacent quantum dots in the adjacent row by the first distance smaller than the second distance between the quantum dots in the adjacent row and adjacent quantum dots in the first row, the first distance being small enough to allow carrier tunneling between adjacent quantum dots and the second distance being large enough to substantially prevent tunneling between adjacent quantum dots and small enough to allow Coulombic interaction between adjacent quantum dots; and electrical contacts positioned on the contact structures at opposite ends of the length, the electrical contacts being spaced from the quantum dots in the plurality of rows a distance to allow tunneling of carriers into and out of quantum dots in the plurality of rows, wherein a first row of the plurality of rows of quantum dots is connected to receive input signals and a second parallel spaced apart row of the plurality of rows of quantum dots is connected to provide an output signal. and wherein quantum dots in the second row are charged oppositely to quantum dots in the first row by Coulombic interaction between adjacent quantum dots so that output signals from the second row are inverted from input signals supplied to the first row.

2. A sparse-carrier device as claimed in claim 1 wherein the first material, the crystallographic facet of the first material and the second material are selected so that the second material forms quantum dots only on the crystallographic facet of the first material.

3. A sparse-carrier device as claimed in claim 1 wherein the width of the crystallographic facet is less than approximately 1.5 µm.

4. A sparse-carrier device as claimed in claim 3 wherein the width of the crystallographic facet is less than approximately 200 nm.

5. A sparse-carrier device as claimed in claim 1 wherein the first material includes gallium arsenide.

6. A sparse-carrier device as claimed in claim 5 wherein the second material includes indium arsenide.

7. A sparse-carrier device as claimed in claim 6 wherein the crystallographic facet of the first material is a (100) facet.

8. A sparse-carrier device as claimed in claim 1 wherein the quantum dots have a diameter of less than approximately 30 nm.

9. A sparse-carrier device comprising:

a crystal structure formed of a first material and having a crystallographic facet with a width and a length, the crystallographic facet having contact structures at opposite ends of the length;

quantum dots formed of a second material and positioned in first and second rows on the crystallographic facet, each row extending along the length of the crystallographic facet and being approximately one quantum dot wide and a plurality of quantum dots long, the crystallographic facet being defined with a width to restrict formation of the second material thereon to the first and second quantum dot wide rows of quantum dots, the quantum dots in the first row being separated from adjacent quantum dots in the first row by a first distance smaller than a second distance between the quantum dots in the first row and adjacent quantum dots in the second row, and the quantum dots in the second row being separated from adjacent quantum dots in the second row by the first distance smaller than the second distance between the quantum dots in the second row and adjacent quantum dots in the first row, the first distance being small enough to allow carrier tunneling between adjacent quantum dots and the second distance being large enough to substantially prevent tunneling between adjacent quantum dots and small enough to allow Coulombic interaction between adjacent quantum dots; and electrical contacts positioned on the contact structures at opposite ends of the length, the electrical contacts being spaced from the quantum dots in the first and second rows a distance to allow tunneling of carriers into and out of quantum dots in the first and second rows, wherein a first row of the plurality of rows of quantum dots is connected to receive input signals and a second parallel spaced apart row of the plurality of rows of quantum dots is connected to provide an output signal, and wherein quantum dots in the second row are charged oppositely to quantum dots in the first row by Coulombic interaction between adjacent quantum dots so that output signals from the second row are inverted from input signals supplied to the first row.

10. A sparse-carrier device as claimed in claim 9 wherein the first distance is approximately 10 nm.

11. A sparse-carrier device as claimed in claim 9 wherein the first distance is approximately 20 nm.

12. A sparse-carrier device as claimed in claim 9 wherein the contact structures include first portions of the crystallographic facet adjacent each of the opposite ends which are wider than an intermediate portion of the crystallographic facet between the first portions, and end portions of the crystallographic facets which are divided to provide separate contact areas for each of the first and second rows.

* * * * *